(12) United States Patent
Sahbari et al.

(10) Patent No.: US 6,319,835 B1
(45) Date of Patent: Nov. 20, 2001

(54) STRIPPING METHOD

(75) Inventors: Javad J. Sahbari, Sunnyvale, CA (US); Edward W. Rutter, Jr., Franklin; Jeffrey M. Calvert, Acton, both of MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/514,064

(22) Filed: Feb. 25, 2000

(51) Int. Cl.$^7$ .................................................. H01L 21/302
(52) U.S. Cl. .......................... 438/689; 438/694; 438/695; 438/692
(58) Field of Search ..................................... 438/689, 691, 438/694, 695; 430/322, 325, 328

(56) References Cited

U.S. PATENT DOCUMENTS

| | | | |
|---|---|---|---|
| 4,518,675 | | 5/1985 | Katoaka . |
| 5,733,714 | * | 3/1998 | McMCulloch et al. ............. 430/325 |
| 5,883,006 | * | 3/1999 | Iba ...................... 438/712 |
| 6,001,541 | * | 12/1999 | Iyer ...................... 430/322 |
| 6,054,254 | * | 4/2000 | Sato et al. ........................... 430/322 |
| 6,103,637 | * | 8/2000 | Torek et al. ......................... 438/745 |

* cited by examiner

*Primary Examiner*—Charles Bowers
*Assistant Examiner*—Brook Kebede
(74) *Attorney, Agent, or Firm*—S. Matthew Cairns

(57) ABSTRACT

Disclosed are compositions useful for removing antireflective compositions from a substrate. Also disclosed are methods of removing antireflective compositions from a substrate using such compositions.

21 Claims, No Drawings

STRIPPING METHOD

BACKGROUND OF THE INVENTION

The present invention relates generally to the field of compositions that reduce reflection of exposing radiation from a substrate back into an overcoated photoresist layer. In particular, the present invention relates to the field of removal of such antireflective coating compositions.

Photoresists are photosensitive films used for transfer of an image to a substrate. A coating layer of a photoresist is formed on a substrate and the photoresist layer is then exposed through a photomask (reticle) to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or cross-link in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are known to the art and described by Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4, both incorporated herein by reference to the extent they teach photoresist compositions and methods of making and using them.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the more important steps in attaining high resolution photoresist images.

Reflection of activating radiation used to expose a photoresist often poses limits on resolution of the image patterned in the photoresist layer. Reflection of radiation from the substrate/photoresist interface can produce variations in the radiation intensity in the photoresist during exposure, resulting in non-uniform photoresist linewidth upon development. Radiation also can scatter from the substrate/photoresist interface into regions of the photoresist where exposure is not intended, again resulting in linewidth variations. The amount of scattering and reflection will typically vary from region to region, resulting in further linewidth non-uniformity.

Reflection of activating radiation also contributes to what is known in the art as the "standing wave effect". To eliminate the effects of chromatic aberration in exposure equipment lenses, monochromatic or quasi-monochromatic radiation is commonly used in photoresist projection techniques. Due to radiation reflection at the photoresist/substrate interface, however, constructive and destructive interference is particularly significant when monochromatic or quasi-monochromatic radiation is used for photoresist exposure. In such cases the reflected light interferes with the incident light to form standing waves within the photoresist. In the case of highly reflective substrate regions, the problem is exacerbated since large amplitude standing waves create thin layers of underexposed photoresist at the wave minima. The underexposed layers can prevent complete photoresist development causing edge acuity problems in the photoresist profile. The time required to expose the photoresist is generally an increasing function of photoresist thickness because of the increased total amount of radiation required to expose an increased amount of photoresist. However, because of the standing wave effect, the time of exposure also includes a harmonic component which varies between successive maximum and minimum values with the photoresist thickness. If the photoresist thickness is non-uniform, the problem becomes more severe, resulting in variable linewidths.

Variations in substrate topography also give rise to resolution-limiting reflection problems. Any image on a substrate can cause impinging radiation to scatter or reflect in various uncontrolled directions, affecting the uniformity of photoresist development. As substrate topography becomes more complex with efforts to design more complex circuits, the effects of reflected radiation become more critical. For example, metal interconnects used on many microelectronic substrates are particularly problematic due to their topography and regions of high reflectivity.

With recent trends towards high-density semiconductor devices, there is a movement in the industry to shorten the wavelength of exposure sources to deep ultraviolet (DUV) light (300 nm or less in wavelength), KrF excimer laser light (248 nm), ArF excimer laser light (193 nm), electron beams and soft x-rays. The use of shortened wavelengths of light for imaging a photoresist coating has generally resulted in increased reflection from the upper resist surface as well as the surface of the underlying substrate. Thus, the use of the shorter wavelengths has exacerbated the problems of reflection from a substrate surface.

Another approach used to reduce the problem of reflected radiation has been the use of a radiation absorbing layer either interposed between the substrate surface and the photoresist coating layer, called a bottom antireflective coating or BARC, or a radiation layer disposed on the surface of the photoresist layer, called a top antireflective coating or TARC. See, for example, PCT Application WO 90/03598, EPO Application No. 0 639 941 A1 and U.S. Pat. Nos. 4,910,122, 4,370,405 and 4,362,809, all incorporated herein by reference to the extent they teach antireflective (antihalation) compositions and the use of the same. Such BARC and TARC layers have also been generally referred to in the literature as antireflective layers or antireflective compositions ("ARCs").

Typically, such antireflective compositions include a radiation absorbing component, or chromophore, a polymeric binder and one or more cross-linking agents. Chromophores such as derivitized anthracenes are particularly suitable for use in 248 nm ARCs as they also function as cross-linkers. Due to the presence of such chromophores and additional cross-linking agents, the resulting cured antireflective compositions, particularly BARCs, are more solvent resistant than coatings resulting from typical photoresist compositions. As a result, stripping compositions employed to remove photoresist prior to subsequent finishing steps do not effectively remove such antireflective coatings. Thus, removal of the photoresist layer may be effected by conventional stripping methods but the antireflective layer remains. The remaining antireflective layer is typically removed by dry processing techniques such as reactive ion etching or ashing.

U.S. Pat. No. 4,518,675 (Kataoka) discloses stripping compositions including dimethylsulfoxide and at least one compound selected form alkali metal alkoxides, alkali metal hydroxides and tetraalkylammonium hydroxides. Such compositions are not disclosed as antireflective composition removers.

It is thus desirable to have a stripping composition that will effectively and quickly remove antireflective compositions.

SUMMARY OF THE INVENTION

It has been surprisingly found that the compositions of the present invention effectively remove antireflective compositions without attack, such as discoloration or lifting of layers, of the substrate. The process of the present invention has the advantage of removing not only antireflective compositions, but also the overlying photoresist compositions. Thus, antireflective compositions and photoresist compositions may be effectively removed in one step according to the present invention.

In one aspect, the present invention provides a method of removing antireflective compositions from a substrate including the step of contacting the antireflective composition with a stripping composition for a period of time to remove the antireflective composition, wherein the stripping composition includes one or more polar aprotic solvents and one or more aggressive bases.

In a second aspect, the present invention provides a method of manufacturing an electronic device including the steps of applying an antireflective composition to a substrate to form an antireflective layer, applying a photoresist composition to the antireflective layer to form a photoresist layer on the antireflective layer, exposing the photoresist layer through a photomask to a source of activating radiation, developing the photoresist layer to produce a pattern, etching the photoresist to transfer the pattern to the substrate, and removing the photoresist layer and the antireflective layer, wherein the antireflective layer is removed by the method described above.

In a third aspect, the present invention provides a method of reworking a substrate including the steps of applying an antireflective composition to a substrate to form an antireflective layer, applying a photoresist composition to the antireflective layer to form a photoresist layer on the antireflective layer, removing the photoresist layer, and removing the antireflective layer, wherein the antireflective layer is removed by the method described above.

DETAILED DESCRIPTION OF THE INVENTION

As used throughout this specification, the following terms shall have the following meanings unless the context clearly indicates otherwise: °C.=degrees Centigrade; min=minute; DMSO=dimethyl sulfoxide; BLO=γ-butyrolactone; TMAH =tetramethylammonium hydroxide; DPM=dipropylene glycol monomethyl ether; DPB =dipropylene glycol mono-n-butyl ether; PNB=propylene glycol n-butyl ether; AEEA= aminoethylaminoethanol; NMP=N-methylpyrrolidone; DMAC=dimethyl acetamide; and % wt=percent by weight. All amounts are percent by weight and all ratios are by weight, unless otherwise noted. All numerical ranges are inclusive.

The terms "antireflective compositions" and "antireflective coatings" are used interchangeably throughout this specification. "Stripping" and "removing" are used interchangeably throughout this specification. Likewise, the terms "stripper" and "remover" are used interchangeably. "Alkyl" refers to linear, branched and cyclic alkyl.

The compositions useful in the process of the present invention include one or more polar aprotic solvents and one or more aggressive bases. Suitable polar aprotic solvents include, but are not limited to, dimethyl sulfoxide and sulfolane. Such polar aprotic solvents are generally commercially available, such as from Aldrich (Milwaukee, Wis.) and may be used without further purification.

Typically, the amount of polar aprotic solvent useful in the present invention is in the range of about 10 to about 99.9% wt, based on the total weight of the stripper composition. It is preferred that the amount of polar aprotic solvent is in the range of about 15 to about 95% wt, and more preferably 20 to 90% wt. When more than one polar aprotic solvent is used in the present invention, the solvents may be combined in any ratio. For example, when two polar aprotic solvents are used in the present invention they may be effectively used in any ratio from about 99:1 to about 1:99.

The one or more aggressive bases useful in the present invention are any that are compatible with the polar aprotic solvents, are effective in removing antireflective coatings and are substantially free of metal ions. Suitable aggressive bases include, but are not limited to, hydroxylamine, hydroxylamine formate, hydroxylamine-buffered with a carboxylic acid, tetra($C_1$–$C_4$)alkylammonium hydroxide, tetra ($C_1$–$C_4$)alkylammonium carbonate, tetra($C_1$–$C_4$) alkylammonium acetate, tetra($C_1$–$C_4$)alkylammonium citrate, choline hydroxide, and the like. It is preferred that the aggressive base is hydroxylamine, hydroxylamine formate, hydroxylamine buffered with a carboxylic acid, tetra($C_1$–$C_4$)alkylammonium hydroxide, hydroxy($C_1$–$C_4$) alkyl tri($C_1$–$C_4$)alkylammonium hydroxide and choline hydroxide. The tetra($C_1$–$C_4$)alkylammonium compounds of the present invention include substituted tetraalkylammonium compounds, such as tetra(hydroxyalkyl)ammonium compounds. Thus, for example, tetra($C_1$–$C_4$) alkylammonium hydroxide includes hydroxy($C_1$–$C_4$)alkyl tri($C_1$–$C_4$)alkylammonium hydroxide such as 2-hydroxyethyl trimethylammonium hydroxide, di(hydroxy ($C_1$–$C_4$)alkyl) di($C_1$–$C_4$)alkylammonium hydroxide, tri (hydroxy($C_1$–$C_4$)alkyl ($C_1$–$C_4$)alkylammonium hydroxide and tetra(hydroxy($C_1$–$C_4$)alkyl)ammonium hydroxide. Suitable tetra($C_1$–$C_4$)alkylammonium hydroxides include tetramaethylammonium hydroxide and tetrabutylammonium hydroxide. Tetramethylammonium hydroxide is typically used as the pentahydrate. Hydroxylamine is typically used as the free base in water, such as 50% aqueous solution. It is preferred that the aggressive bases are free of metal ions, particularly sodium, potassium and the like. Such aggressive bases are generally commercially available, such as from Aldrich (Milwaukee, Wis.) and may be used without further purification.

Typically, the aggressive bases of the present invention are used in an amount in the range of from about 0.1 to about 45% wt, based on the total weight of the stripper composition. It is preferred that the aggressive bases are present in an amount of from about 1 to about 25% wt, and more preferably from about 2 to about 10% wt. When more than one aggressive base is used in the present invention, they may be combined in any ratio. For example, when two aggressive bases are used in the present invention they may be effectively used in any ratio from about 99:1 to about 1:99, and preferably from about 1 to about 45% wt. Particularly suitable mixtures of aggressive bases include tetra ($C_1$–$C_4$)alkylammonium hydroxide and choline hydroxide, tetra($C_1$–$C_4$)alkylammonium hydroxide and hydroxylamine, tetra($C_1$–$C_4$)alkylammonium hydroxide and hydroxylamine formate, and tetra($C_1$–$C_4$) alkylammonium hydroxide and hydroxylamine-buffered with a carboxylic acid. Preferred mixtures of aggressive bases are tetra($C_1$–$C_4$)alkylammonium hydroxide and hydroxylamine buffered with a carboxylic acid or tetra ($C_1$–$C_4$)alkylammonium hydroxide and hydroxylamine, and particularly preferred mixtures are tetramethylammonium hydroxide and hydroxylamine buffered with a carboxylic acid or tetramethylammonium hydroxide and hydroxylamine.

The stripping compositions useful in the present invention may optionally include one or more other additives. Suitable optional additives include, but are not limited to, cosolvents, corrosion inhibitors, surfactants, and the like.

Suitable cosolvents include, but are not limited to, ($C_1$–$C_{20}$)alkanediols such as ethylene glycol, diethylene glycol, propylene glycol, 2-methylpropanediol and dipropylene glycol; ($C_1$–$C_{20}$)alkanediol ($C_1$–$C_6$)alkyl ethers such as propylene glycol monomethyl ether, propylene glycol dimethyl ether, propylene glycol n-butyl ether, dipropylene glycol monomethyl ether, dipropylene glycol dimethyl ether, dipropyleneglycol monobutyl ether, and propylene glycol methyl ether acetate; aminoalcohols such as aminoethylaminoethanol; N-($C_1$–$C_{10}$)alkylpyrrolidones such as N-methylpyrrolidone, N-ethylpyrrolidone, N-hydroxyethylpyrrolidone and N-cyclohexylpyrrolidone; lactones such as y-butyrolactone; water; and the like. It is preferred that the cosolvent is one or more of ($C_1$–$C_{20}$) alkanediols, ($C_1$–$C_{20}$)alkanediol ($C_1$–$C_6$)alkyl ethers and aminoalcohols, and more preferably one or more of propylene glycol monomethyl ether, propylene glycol dimethyl ether, propylene glycol n-butyl ether, dipropylene glycol monomethyl ether, dipropylene glycol dimethyl ether, dipropyleneglycol monobutyl ether, propylene glycol methyl ether acetate and aminoethylaminoethanol.

When such cosolvents are used they are typically present in an amount in the range of about 5 to about 80% wt, based on the total weight of the stripping composition, and preferably about 10 to about 45% wt. It is preferred that one or more cosolvents are used in the present invention. Any ratio of polar aprotic solvent to cosolvent from 99:1 to 1:99 may be used in the present invention, and preferably from 90:10 to 60:40. When water is used as the cosolvent, it is typically present in an amount of from 1 to about 30 % wt, and preferably from about 1 to about 25% wt, based on the total weight of the composition.

Suitable corrosion inhibitors useful in the present invention include, but are not limited to, catechol; ($C_1$–$C_6$) alkylcatechol such as methylcatechol, ethylcatechol and tert-butylcatechol; benzotriazole; ($C_1$–$C_{10}$) alkylbenzotriazoles; gallic acid; gallic acid esters such as methyl gallate and propyl gallate; and the like. It is preferred that the corrosion inhibitor is catechol, ($C_1$–$C_6$)alkylcatechol , benzotriazole or ($C_1$–$C_{10}$) alkylbenzotriazoles. When such corrosion inhibitors are used they are typically present in an amount in the range of about 0.01 to about 10% wt, based on the total weight of the stripping composition. It is preferred that the amount of corrosion inhibitor is from about 0.2 to about 5% wt, more preferably about 0.5to about 3% wt, and most preferably from about 1.5to about 2.5% wt. It is preferred that at least one corrosion inhibitor be used in the stripping compositions of the present invention.

Nonionic and cationic surfactants may be used with the stripping compositions of the present invention. Nonionic surfactants are preferred. Such surfactants are generally commercially available. Typically, such surfactants are used in an amount of from about 0.2 to about 5% wt, preferably from about 0.5 to about 3% wt, and more preferably from about 1.5 to about 2.5% wt, based on the total weight of the composition.

The stripping compositions may be prepared by combining the one or more polar aprotic solvents and the one or more aggressive bases in any order. When a cosolvent is used, it is preferred that the polar aprotic solvent and cosolvent are blended first, followed by the one or more aggressive bases and then by any other optional additives.

In removing antireflective coatings, the stripping compositions of the present invention are typically heated. Such heating has the advantage of shortening the time required for complete removal of the antireflective compositions. Typically, the stripping compositions of the present invention are heated at a temperature of about 30° C. to about 120° C., preferably about 40° C. to about 90° C., and more preferably about 50° C. to about 85° C. It is preferred that the stripping compositions of the present invention are heated.

Any antireflective composition may be effectively removed from a substrate by contacting the antireflective composition with the stripping compositions of the present invention for a period of time sufficient to remove the antireflective compositions. Typically, the antireflective compositions are substantially removed, and preferably completely removed, from the substrate in less than one hour. For example, when the stripping compositions of the present invention are heated to about 65° to about 85° C., antireflective compositions are effectively removed from a substrate in about 30 minutes or less.

Antireflective compositions may be removed from a substrate by placing the substrate in a vessel containing a stripping composition of the present invention or by dispensing a stripper composition of the present invention on the substrate, such as by spraying. It is preferred that the stripper composition is heated. When the substrate is placed in a vessel, it is preferred that the level of stripper composition in the vessel be sufficient to completely immerse the antireflective coating layer.

An advantage of the present invention is that after the substrate is removed from contact with the stripping composition of the present invention, the substrate can be then be rinsed with water, such as DI water, and subsequently processed. This avoids the conventional step of dipping the stripped substrate in iso-propanol prior to rinsing with water.

The stripping compositions of the present invention are effective in removing antireflective compositions as well as photoresist compositions. Thus, the present invention is particularly useful in removing photoresist and antireflective layers in the manufacture of electronic devices, particularly in the manufacture of semiconductors. When the present invention is used in the manufacture of electronic devices, the substrate is typically a wafer.

Thus the stripper compositions of the present invention are useful in the manufacture of an electronic device including the steps of applying an antireflective composition to a substrate to form an antireflective layer, applying a photoresist composition to the antireflective layer to form a photoresist layer on the antireflective layer, exposing the photoresist layer through a photomask to a source of activating radiation, developing the photoresist layer to produce a pattern, etching the photoresist to transfer the pattern to the substrate, and removing the photoresist layer and the antireflective layer, wherein the antireflective layer is removed by the method of the present invention. It will be appreciated by those skilled in the art that a known photoresist stripper may be used to remove the photoresist followed by the stripper compositions of the present invention to remove the antireflective coating. It is preferred that the stripper compositions of the present invention are used to remove both the photoresist and the antireflective coating.

An advantage of the present invention is that it permits rework of the substrate at the lithographic cell unit operation level. For example, should there be a problem with the photoresist layer, both the photoresist and antireflective layers may be effectively removed according to the present invention to provide a clean substrate. Thus, the present invention provides a method of reworking a substrate including the steps of applying an antireflective composition to a substrate to form an antireflective layer, applying a photoresist composition to the antireflective layer to form a photoresist layer on the antireflective layer, removing the photoresist layer, and removing the antireflective layer, wherein the antireflective layer is removed by the method described above. The resulting clean substrate could then be reprocessed by applying a new antireflective coating layer and then a new photoresist layer.

The following examples are intended to illustrate further various aspects of the present invention, but are not intended to limit the scope of the invention in any aspect.

EXAMPLE 1

The formulations reported in Table 1 were used in the following examples. "Buffered hydroxylamine" refers to hydroxylamine buffered with carboxylic acid. Samples A–C and E–I were commercially available photoresist strippers. In each sample, the optional additives were present in an amount of 1 to 5% wt, the cosolvent was present in an amount of 20 to 35% wt, and the solvent was present in an amount of 60 to 80% by weight, all based on the total weight of the composition. In samples C and D, base was present in an amount of 15 to 20% wt, based on the total weight of the composition.

TABLE 1

| Sample | Solvent | Cosolvent | Base | Optional Additives |
|---|---|---|---|---|
| A | DMAC | BLO + NMP | | nonionic surfactant |
| B | DMSO | DPM + dibasic esters | none | corrosion inhibitor, nonionic surfactant |
| C | sulfolane | AEEA + C$_4$-diol | hydroxylamine formate | corrosion inhibitor |
| D | DMSO | DPB + C$_4$-diol | TMAH + buffered hydroxylamine | corrosion inhibitor |
| E | NMP | DPM + AEEA + PNB | none | corrosion inhibitor, nonionic surfactant |
| F | DMSO | AEEA + PNB | none | corrosion inhibitor, nonionic surfactant |
| G | DMSO | DPM + PNB | none | corrosion inhibitor |
| H | DMSO | DPM + PNB | none | none |

EXAMPLE 2

Two sets of wafers, each set coated with a commercial antireflective coating, were cut into small pieces. One set of wafers was coated with AR™ antireflective coating and the other was coated with ARC™ antireflective coating, both available from the Shipley Company, Marlborough, Mass. One piece of wafer was placed in a beaker along with 100 mL of the stripping compositions from Example 1. The wafers remained in the stripping compositions for 30 minutes at room temperature. The wafers were then removed, rinsed with DI water and visually inspected to determine the effectiveness of each of the samples from Example 1. The wafers were then inspected using FE/SEM for the effectiveness of the stripping compositions in removing the ARC residue. The results were the same for both antireflective compositions. The results are reported in Table 2. Effectiveness is reported as the percentage of ARC residue removed from the wafer surface.

TABLE 2

| Sample | Results | Effectiveness (%) |
|---|---|---|
| A | Not cleaned | 50 |
| B | Not cleaned | 40 |
| C | Not cleaned/discolored | 60 |
| D | Not cleaned/discolored | 65 |
| E | Not cleaned | 40 |
| F | Not cleaned | 45 |
| G | Not cleaned | 35 |
| H | Not cleaned | 50 |

From these data it can be seen that none of the stripping compositions were effective at removing the antireflective compositions after 30 minutes at room temperature.

EXAMPLE 3

The procedure of Example 2 was repeated except that the stripping composition was heated at either 75° C. or 80° C. The results were the same for both antireflective compositions. The results are reported in Table 3.

TABLE 3

| Sample | Results | Effectiveness (%) |
|---|---|---|
| A | Not cleaned | 80 |
| B | Not cleaned | 80 |
| C | complete removal | 100 |
| D | complete removal | 100 |
| E | Layer lifting, flaking | 75 |
| F | Layer lifting, flaking | 70 |
| G | Not cleaned | 60 |
| H | Layer lifting | 70 |
| I | Not cleaned | 50 |

From the above data it can be clearly seen that samples c and d, which contained both polar aprotic solvents and aggressive bases, were effective in completely removing the antireflective compositions without discoloring the substrate or lifting layers on the substrate.

What is claimed is:

1. A method of removing antireflective compositions from a substrate comprising the step of contacting the antireflective composition with a stripping composition for a period of time to remove the antireflective composition, wherein the stripping composition comprises one or more polar aprotic solvents and one or more aggressive bases and wherein the antireflective composition comprises polymer binder and one or more cross-linking agents.

2. The method of claim 1 wherein the polar aprotic solvent is selected from dimethyl sulfoxide or sulfolano.

3. The method of claim 1 wherein the polar aprotic solvent is present in an amount in the range of about 10 to about 99.9% wt, based on the total weight of the stripping composition.

4. The method of claim 1 wherein the aggressive base is selected from hydrloxylamine, hydroxylanine formats, hydroxylartine-buffered with a carboxylic acid, tetra($C_1$–$C_4$) alkylammonium hydroxide, tetra($C_1$–$C_4$)alkyl,ammonium carbonate, tetra($C_1$–$C_4$)alkylammonium acetate, tetra ($C_1$–$C_4$)alkylammonium citrate or choline hydroxide.

5. The method of claim 4 wherein the aggressive base is selected from hydroxylamine, hydroxylamine formate, hydroxylamine buffered with a carboxylic acid, tetra($C_1$–$C_4$) alkylammonium hydroxide or choline hydroxide.

6. The method of claim 4 wherein the tetra($C_1$–$C_4$) alkylammonium hydroxide is selected from tetramethylammonium hydroxide or tetrabutylammonium hydroxide.

7. The method of claim 4 wherein the aggressive base comprises a mixture selected from tetra($C_1$–$C_4$) alkylammonium hydroxide and hydroxylamine buffered with a carboxylic acid or tetra($C_1$–$C_4$)alkylammonium hydroxide and hydroxylamine.

8. The method of claim 1 wherein the aggressive base is present in an amount in the range of about 0.1to about 45% wt, based on the total weight of the stripping composition.

9. The method of claim 1 wherein the stripping composition further comprises one or more of cosolvents, corrosion inhibitors or wetting agents.

10. The method of claim 9 wherein the cosolvents are selected from ($C_1$–$C_{20}$)alkanediols, ($C_1$–$C_{20}$)alkanediol ($C_1$–$C_6$)alkyl ethers, aminoalcohols; N-($C_1$–$C_{10}$) alkylpyrrolidones; lactones or water.

11. The method of claim 10 wherein the cosolvent is present in an amount in the range of about 5 to about 80% wt.

12. The method of claim 9 wherein the corrosion inhibitors are selected from catechol, ($C_1$–$C_6$)alkylcatechols, benzotriazole or ($C_1$–$C_{10}$)alkylbenzotriazoles.

13. The method of claim 12 wherein the corrosion inhibitor is present in an amount in the range of about 0.01 to about 10% wt.

14. A method of manufacturing an electronic device including the steps of applying an antireflective composition to a substrate to form an antireflective layer, applying a photoresist composition to the antireflective layer to form a photoresist layer on the ancireflective layers exposing the photoresist layer through a photomask to a source of activating radiation, developing the photoresist layer to produce a pattern, etching the photoresist to transfer the pattern to the substrate, and removing the photoresist layer and the antireflective layer, wherein the antireflective layer is removed by a method comprising the step of contacting the antireflective composition with a stripping composition for a period of time to remove the antireflective composition, wherein the stripping composition comprises one or more polar aprotic solvents and one or more aggressive bases and wherein the antireflective composition comprises polymer binder and one or more cross-linking agents.

15. The method of claim 14 wherein the polar aprotic solvent is selected from dimethyl sulfoxide or sulfolane.

16. The method of claim 14 wherein the aggressive base is selected from hydroxylamine, hydroxylamine formate, hydroxylamine buffered with a carboxylic acid, tetra($C_1$–$C_4$) alkylammonium hydroxide, tetra($C_1$–$C_4$)alkylammonium carbonate, tetra ($C_1$–$C_4$)alkylammonium acetate or tetra ($C_1$–$C_4$)alkylammonium citrate.

17. A method of reworking a substrate including the steps of applying an antireflective composition to a substrate to form an antireflective layer, applying a photoresist composition to the antireflective layer to form a photoresist layer on the antireflective layer, removing the photoresist layer, and removing the antireflective layer, wherein the antireflective layer is removed by a method comprising the step of contacting the antireflective composition with a stripping composition for a period of time to remove the antireflective composition wherein the stripping composition comprises one or more polar aprotic solvents and one or more aggressive bases and wherein the antireflective composition comprises polymer binder and one or more cross-linking agents.

18. The method of claim 14 further comprising the step of heating the stripping composition at a temperature of about 30 to about 120° C.

19. The method of claim 17 further comprising the step of heating the stripping composition at a temperature of about 30 to about 120° C.

20. The method of claim 1 wherein the antireflective composition comprises a chromophore, a polymeric binder and one or more cross-linking agents.

21. The method of claim 1 further comprising the step of heating the stripping composition at a temperature of about 30 to about 120° C.

* * * * *